s010269594B2

United States Patent
Lee et al.

(10) Patent No.: US 10,269,594 B2
(45) Date of Patent: Apr. 23, 2019

(54) TRANSPARENT PLATE AND SUBSTRATE PROCESSING SYSTEM THEREWITH

(71) Applicant: Samsung Electronics Co., Ltd., Suwon-si, Gyeonggi-do (KR)

(72) Inventors: Nam Hoon Lee, Ansan-si (KR); Jungwoo Seo, Hwaseong-si (KR); Joonghan Shin, Yongin-si (KR); Byung Joo Oh, Seoul (KR); Jeongmin Lee, Suwon-si (KR); Gi-Nam Park, Incheon (KR); Jonghyun Lee, Bucheon-si (KR)

(73) Assignee: Samsung Electronics Co., Ltd. (KR)

( * ) Notice: Subject to any disclaimer, the term of this patent is extended or adjusted under 35 U.S.C. 154(b) by 373 days.

(21) Appl. No.: 15/203,399

(22) Filed: Jul. 6, 2016

(65) Prior Publication Data

US 2017/0076965 A1    Mar. 16, 2017

(30) Foreign Application Priority Data

Sep. 11, 2015    (KR) .................. 10-2015-0128907

(51) Int. Cl.
| | |
|---|---|
| H05B 3/00 | (2006.01) |
| F21V 9/00 | (2018.01) |
| G02B 5/00 | (2006.01) |
| G02B 5/20 | (2006.01) |
| C23C 14/48 | (2006.01) |
| H01L 21/67 | (2006.01) |
| H01L 21/687 | (2006.01) |

(52) U.S. Cl.
CPC ........ *H01L 21/67115* (2013.01); *C23C 14/48* (2013.01); *G02B 5/003* (2013.01); *G02B 5/205* (2013.01); *H01L 21/6875* (2013.01); *H01L 21/68735* (2013.01); *H01L 21/68757* (2013.01); *H05B 3/0047* (2013.01)

(58) Field of Classification Search
None
See application file for complete search history.

(56) References Cited

U.S. PATENT DOCUMENTS

| | | | | |
|---|---|---|---|---|
| 6,188,838 | B1 * | 2/2001 | Mikata ................ | C30B 31/14 |
| | | | | 118/724 |
| 6,483,989 | B1 * | 11/2002 | Okada ............. | H01L 21/67109 |
| | | | | 118/724 |
| 7,070,660 | B2 * | 7/2006 | Keeton ............. | C23C 16/45521 |
| | | | | 118/500 |
| 8,454,356 | B2 * | 6/2013 | Camm ................ | F27D 5/0037 |
| | | | | 219/443.1 |

(Continued)

FOREIGN PATENT DOCUMENTS

| | | |
|---|---|---|
| JP | 4317883 B2 | 5/2009 |
| KR | 10-0657501 B1 | 12/2006 |

(Continued)

*Primary Examiner* — Thor S Campbell
(74) *Attorney, Agent, or Firm* — Myers Bigel, P.A.

(57) ABSTRACT

A transparent plate and a substrate processing system including the same are disclosed. The substrate processing system may include a chamber, a lamp provided below the chamber, and a plate provided in the chamber to load a substrate. The plate may include a center region having a first transmittance value and an edge region having with a second transmittance value higher than the first transmittance value.

18 Claims, 10 Drawing Sheets

(56) References Cited

U.S. PATENT DOCUMENTS

| | | |
|---|---|---|
| 8,859,443 B2 | 10/2014 | Yokouchi |
| 9,023,740 B2 | 5/2015 | Kato |
| 2001/0002948 A1* | 6/2001 | Aschner .................. C30B 25/12 |
| | | 392/418 |
| 2004/0037543 A1* | 2/2004 | Kusuda ............ H01L 21/67115 |
| | | 392/416 |
| 2004/0105670 A1* | 6/2004 | Kusuda ............ H01L 21/68735 |
| | | 392/418 |
| 2005/0284371 A1* | 12/2005 | McFadden ............ C23C 16/401 |
| | | 118/715 |
| 2006/0032848 A1 | 2/2006 | Lee et al. |
| 2011/0177624 A1 | 7/2011 | Camm et al. |
| 2011/0303654 A1* | 12/2011 | Nasman ............... H05B 3/0033 |
| | | 219/634 |
| 2013/0043229 A1 | 2/2013 | Kiyama et al. |
| 2013/0148948 A1* | 6/2013 | Kato ................. H01L 21/67115 |
| | | 392/416 |
| 2013/0203269 A1* | 8/2013 | Yokouchi ................ H01L 21/26 |
| | | 438/795 |
| 2013/0206747 A1 | 8/2013 | Nishide |
| 2013/0248504 A1 | 9/2013 | Kusuda |
| 2013/0259457 A1 | 10/2013 | Yokouchi et al. |
| 2014/0169772 A1 | 6/2014 | Abe et al. |
| 2014/0270734 A1* | 9/2014 | Yokouchi ............. H05B 3/0047 |
| | | 392/416 |
| 2015/0010853 A1* | 1/2015 | Fukaya .................... G03F 1/32 |
| | | 430/5 |
| 2016/0010239 A1* | 1/2016 | Tong .................. C23C 16/4584 |
| | | 392/416 |
| 2016/0049317 A1* | 2/2016 | Lee .................. H01L 21/67103 |
| | | 118/725 |
| 2017/0011922 A1* | 1/2017 | Tanimura ............ H01L 21/2253 |

FOREIGN PATENT DOCUMENTS

| | | |
|---|---|---|
| KR | 10-2010-0079168 A | 7/2010 |
| KR | 10-2011-0064421 A | 6/2011 |
| KR | 10-2014-0007523 A | 1/2014 |
| KR | 10-1411385 B1 | 6/2014 |
| WO | WO 2009/137940 A1 | 11/2009 |

\* cited by examiner

| Position | a | b | c | d | e | f |
|---|---|---|---|---|---|---|
| Standard Deviation of Displacement (STD) | 0.38 | 0.27 | 0.27 | 0.34 | 0.44 | 0.58 |

TRANSPARENT PLATE AND SUBSTRATE PROCESSING SYSTEM THEREWITH

CROSS-REFERENCE TO RELATED APPLICATION

This U.S. non-provisional patent application claims priority under 35 U.S.C. § 119 to Korean Patent Application No. 10-2015-0128907, filed on Sep. 11, 2015, in the Korean Intellectual Property Office, the entire contents of which are hereby incorporated herein by reference.

FIELD

The present disclosure relates to a semiconductor device fabrication system, and in particular, to a transparent plate and a substrate processing system including the same.

BACKGROUND

In general, semiconductor devices may be manufactured using a plurality of unit processes, such as a deposition process, a diffusion process, a thermal treatment process, a photo-lithography process, a polishing process, an etching process, an ion implantation process, and a cleaning process. The thermal treatment process may include heating a substrate up to a high temperature. Impurities injected in the substrate may be activated or stabilized by the thermal treatment process.

SUMMARY

Exemplary embodiments of the inventive concept provide a transparent plate capable of preventing a process failure from occurring at an edge region of the substrate in a thermal treatment process and a substrate processing system including the same.

According to exemplary embodiments of the inventive concept, a substrate processing system may include a chamber, a lamp provided below the chamber, and a plate provided in the chamber to load a substrate. The plate may include a center region having a first transmittance and an edge region enclosing the center region having a second transmittance higher than the first transmittance.

According to exemplary embodiments of the inventive concept, a transparent plate may include a center region having a first transmittance and an edge region enclosing the center region and having a second transmittance higher than the first transmittance.

According to exemplary embodiments of the inventive concept, a substrate processing system may include a chamber, a lamp provided below the chamber, a plate provided in the chamber, and pins provided on the plate to support a substrate. The pins may be provided on a region of the plate defined by two circles with radii of $\frac{3}{5}*R$ and $\frac{2}{3}*R$, where R is a radius of the substrate.

According to exemplary embodiments of the inventive concept, a substrate processing system may include a chamber, a bottom lamp provided below the chamber, a plate provided in the chamber, and pins provided on the plate to support a substrate. The plate may include a center region provided between the pins to have a first transmittance and an edge region provided to define pin holes for holding the pins. The edge region may have a second transmittance different from the first transmittance.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
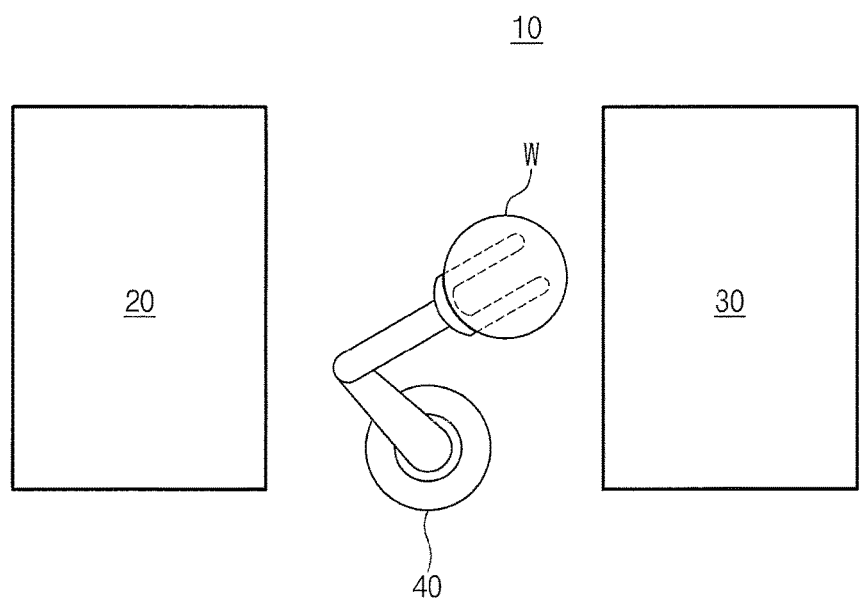
FIG. 1 is a diagram schematically illustrating a semiconductor device fabrication system according to exemplary embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a diagram schematically illustrating a semiconductor device fabrication system according to exemplary embodiments of the inventive concept.

Referring to FIG. 1, a semiconductor device fabrication system 10 may be configured to perform at least one unit process on a substrate W. For example, the unit process may be one of an ion implantation process and a thermal treatment process. Alternatively, the unit process may be one of a deposition process, a photolithography process, a diffusion process, a polishing process, a cleaning process, and an ashing process. In exemplary embodiments, the semiconductor device fabrication system 10 may include an ion implantation system 20, a thermal treatment system 30, and a transfer system 40. The ion implantation system 20 may be configured to inject impurities into the substrate W. The substrate W may be or include a semiconductor wafer. Alternatively, the substrate W may be or include a transparent (e.g., glass or plastic) substrate. The thermal treatment system 30 may be configured to heat the substrate W to a high temperature and thereby to activate the impurities. Alternatively, the semiconductor device fabrication system 10 may be configured to have solely the thermal treatment system 30, without the ion implantation system 20. The transfer system 40 may be disposed between the ion implantation system 20 and the thermal treatment system 30. The transfer system 40 may be configured to transfer the substrate W, for example, from the thermal treatment system 30 to the ion implantation system 20 or vice versa.

Hereinafter, the thermal treatment system 30 will be described in more detail.

Figure 2:
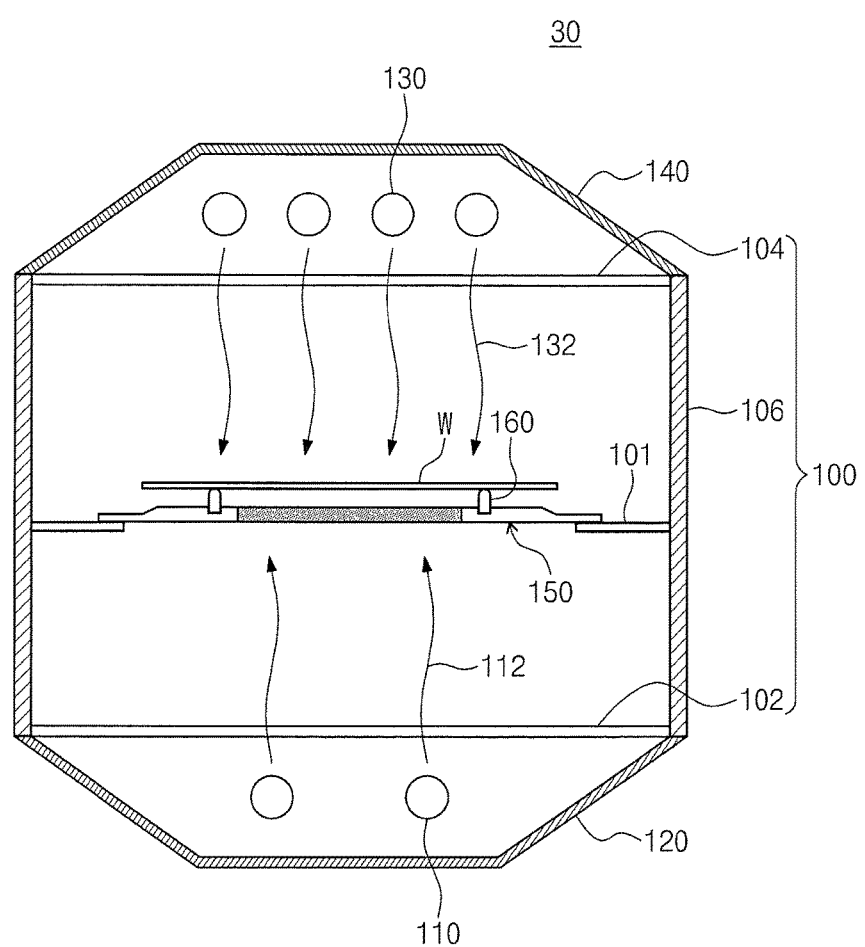
FIG. 2 is a sectional view illustrating an example of a thermal treatment system of FIG. 1.

FIG. 2 is a sectional view illustrating an example of the thermal treatment system 30 of FIG. 1.

Referring to FIG. 2, the thermal treatment system 30 may include a rapid thermal annealing (RTA) system. Alternatively, the thermal treatment system 30 may include a rapid thermal process (RTP) system, a thermal deposition system, or a diffusion system. In exemplary embodiments, the thermal treatment system 30 may include a chamber 100, bottom lamps 110, a bottom reflection housing 120, top lamps 130, a top reflection housing 140, a plate 150, and supporting pins 160. The substrate W may be disposed in the chamber 100. The bottom lamps 110 and the top lamps 130 may be configured to emit a bottom light 112 and a top light 132, respectively, toward the substrate W. The bottom reflection housing 120 and the top reflection housing 140 may be configured to reflect the bottom light 112 and the top light 132, respectively, toward the substrate W.

The chamber 100 may be configured to provide a room for isolating the substrate W from the outer space. The chamber 100 may be filled with nitrogen (N2) gas and may be configured to have atmospheric pressure. Alternatively, the chamber 100 may be configured to have pressure lower than atmospheric pressure. For example, the chamber 100 may include a bottom wall 102, a top wall 104, and a side wall 106. The bottom wall 102 and the top wall 104 may be transparent. For example, the bottom wall 102 and the top wall 104 may be formed of or include glass. Accordingly, the bottom wall 102 and the top wall 104 may allow the bottom light 112 and the top light 132 to pass therethrough. The side wall 106 may be disposed to connect the bottom wall 102 to the top wall 104. The side wall 106 may be configured to reflect the bottom light 112 and the top light 132 toward the substrate W. For example, the side wall 106 may be formed of or include a metallic material. Alternatively, the side wall 106 may include a glass layer and a reflective coating layer on the glass layer.

The bottom lamps 110 may be disposed below the bottom wall 102 of the chamber 100. Each of the bottom lamps 110 may include an arc lamp. The bottom light 112 emitted from the bottom lamp 110 may pass through the bottom wall 102 and the plate 150. The bottom light 112 may be incident onto a bottom surface of the substrate W. The irradiation of the bottom light 112 may last for a period of several seconds to several tens of seconds, and as a result, temperature of the substrate W may be increased from room temperature to about 500° C.

The bottom reflection housing 120 may be disposed below the bottom lamps 110. The bottom reflection housing 120 may be configured to reflect the bottom light 112 toward the substrate W.

The top lamps 130 may be disposed over the top wall 104 of the chamber 100. Each of the top lamps 130 may include an arc lamp. The top light 132 emitted from the top lamp 130 may pass through the top wall 104. The top light 132 may be incident onto the top surface of the substrate W. The irradiation of the top light 132 may last for a period of about several milliseconds to several tens of milliseconds, and as a result, the temperature of the substrate W may be increased to about 1000° C.-1500° C.

The top reflection housing 140 may be disposed over the top lamps 130. The top reflection housing 140 may be configured to reflect the top light 132 toward the substrate W disposed in the chamber 100.

The plate 150 may be supported by wall frames 101 in the chamber 100. The substrate W may be provided on the plate 150. The plate 150 may be configured to allow the substrate W to be loaded thereon. In exemplary embodiments, the plate 150 may be transparent. Accordingly, the plate 150 may allow the bottom light 112 to pass therethrough. For example, the plate 150 may be formed of or include quartz or sapphire.

The supporting pins 160 may be disposed on the plate 150. The supporting pins 160 may support the substrate W. The substrate W may be parallel to the plate 150. For example, the supporting pins 160 may be formed of or include the same material (e.g., quartz or sapphire) as the plate 150. Alternatively, the supporting pins 160 may be formed of or include at least one of Teflon, epoxy resin, or elastomers.

Figure 3:
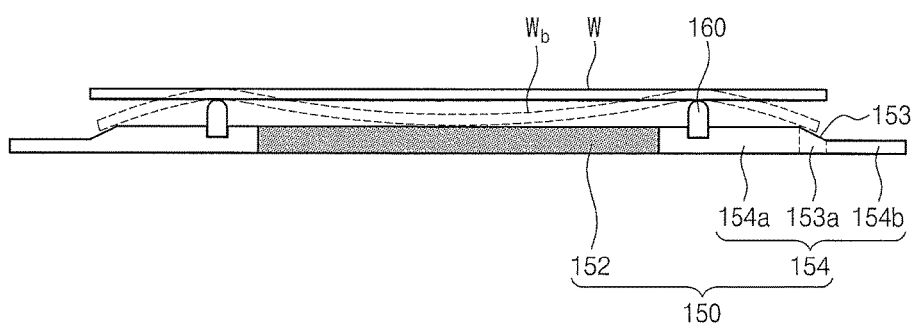
FIG. 3 is a sectional view illustrating an example of a plate of FIG. 2.

FIG. 3 illustrates an example of the plate 150 of FIG. 2.

Referring to FIG. 3, the plate 150 may include a center region 152 and an edge region 154. The center region 152 may be disposed between the supporting pins 160. The edge region 154 may be provided to enclose the center region 152.

The edge region 154 may be positioned outside the supporting pins 160. For example, the edge region 154 may include a flat region 154a, a recess region 154b, and an inclined region 153a. The flat region 154a may be disposed adjacent to the center region 152. The flat region 154a may have a top surface that is positioned at substantially the same level as that of the center region 152. The recess region 154b may be disposed spaced apart from the center region 152. The recess region 154b may have a top surface lower than that of the center region 152. The inclined region 153a may be disposed between the flat region 154a and the recess region 154b. When viewed in a plan view, the inclined region 153a may be aligned to an edge of the substrate W. In the case where the substrate W is heated by the bottom light 112 and the top light 132, the substrate W may be bent in a vertical direction. An edge of such a bent substrate Wb may be in contact with an inclined surface 153 of the inclined region 153a. The inclined surface 153 may make it possible to suppress or prevent the edge of the bent substrate Wb from being damaged.

The center region 152 and the edge region 154 may be different from each other in terms of their light transmittance capabilities. In exemplary embodiments, the center region 152 may have a first light transmittance value that is lower than a second light transmittance value of the edge region 154. For example, the center region 152 may be formed of or include sapphire, and the edge region 154 may be formed of or include quartz, whose light transmittance value is higher than that of the sapphire. Alternatively, both of the center region 152 and the edge region 154 may be formed of or include the same material (e.g., quartz). The center region 152 may be formed to contain opaque impurities. The opaque impurities may include at least one of, for example, metallic materials or colored materials. In the case where the center region 152 and the edge region 154 contain opaque impurities, a concentration of the opaque impurity may be higher in the center region 152 than in the edge region 154. The difference in concentration of the opaque impurity may make it possible to allow the plate 150 to have dual light transmittance values. In certain embodiments, the plate 150 may be configured to have multiple light transmittance values.

Figure 4:
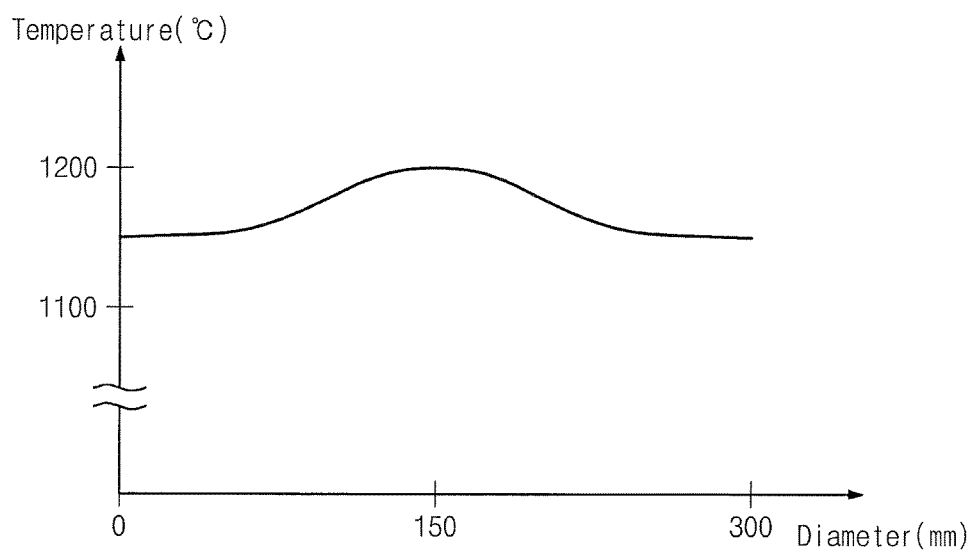
FIG. 4 is a graph showing temperature of a substrate, which is disposed on a conventional plate with a single transmittance value.

FIG. 4 is a graph showing temperature of the substrate W, which is disposed on a conventional plate with a single transmittance value.

Referring to FIGS. 2 and 4, in the case where a conventional plate has a single transmittance value, the use of the conventional plate may lead to a non-uniform heating of a wafer thereon. For example, in the case where the conventional plate is used, the temperature of the substrate W may be higher at a center region thereof than at an edge region thereof. Although the use of the conventional plate allows the bottom light 112 to uniformly pass therethrough, the bottom light 112 may be concentrated on the center region of the substrate W. This may be because the bottom lamps 110 are mainly disposed below the center region 152. Alternatively, this may be because that owing to the reflection of the bottom light 112 by the bottom reflection housing 120, the bottom light 112 may be concentrated on the center region of the substrate W. As a result, the center region of the substrate W may be heated to have a higher temperature than that of the edge region thereof. As an example, the center region of the substrate W may be heated up to about 1200° C., and the edge region of the substrate W may be heated up to about 1150° C. The use of the conventional plate with a single transmittance value may lead to a spatial variation in temperature of the substrate W and the consequent failure in a process of thermally treating the substrate W or the edge region of the substrate W.

Figure 5:
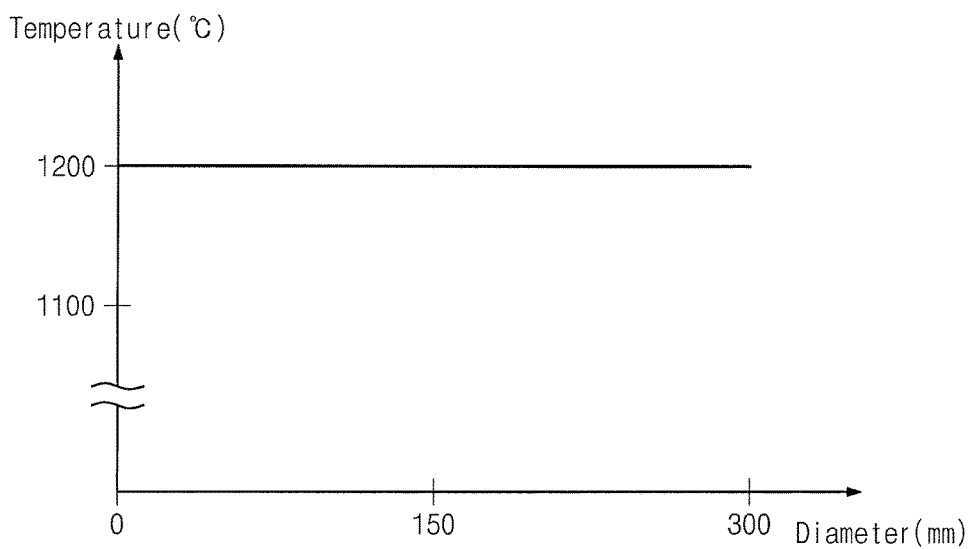
FIG. 5 is a graph illustrating temperature of a substrate, which is disposed on a plate of FIG. 3 according to exemplary embodiments of the inventive concept.

FIG. 5 is a graph illustrating temperature of a substrate, which is disposed on the plate 150 according to exemplary embodiments of the inventive concept.

Referring to FIGS. 2, 3, and 5, the use of the plate 150 may make it possible to reduce a spatial variation in temperature of the substrate W. The center region 152 of the plate 150 may be configured to scatter a fraction of the bottom light 112 propagating toward the center region of the substrate W. Alternatively, the center region 152 may be configured to absorb a fraction of the bottom light 112 propagating toward the center region of the substrate W. That is, the plate 150 may be configured to allow the bottom light 112 with the same intensity to pass through the center region 152 and the edge region 154. The entire region of the substrate W may be uniformly heated up to a temperature of about 1200° C. Accordingly, it is possible to prevent a process failure from occurring in the process of thermally treating the substrate W or the edge region of the substrate W.

Referring back to FIG. 3, the supporting pins 160 may be disposed on the flat region 154a of the edge region 154 or adjacent to the center region 152. In certain embodiments, the supporting pins 160 may be disposed on the center region 152 or adjacent to the edge region 154.

Figure 6:
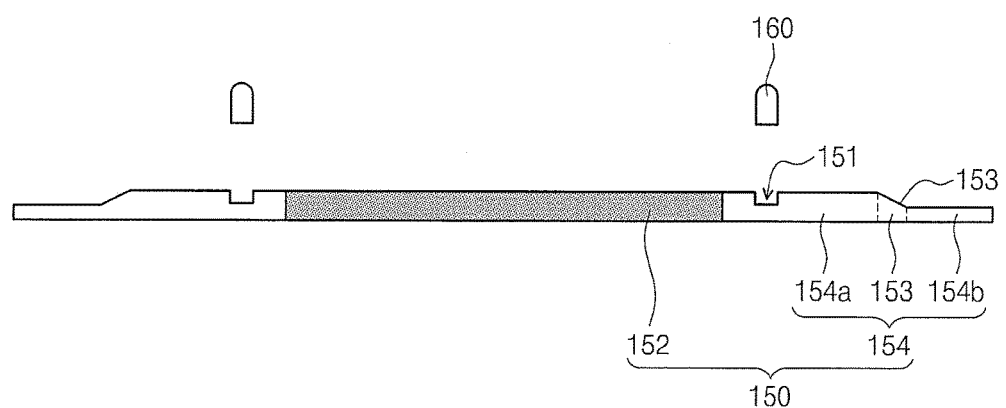
FIG. 6 is an exploded sectional view illustrating a plate and supporting pins of FIG. 3.

FIG. 6 is an exploded sectional view illustrating the plate 150 and the supporting pins 160 of FIG. 3.

Referring to FIG. 6, the plate 150 may be provided to have pin holes 151. The supporting pins 160 may be inserted into the pin holes 151 of the plate 150. The supporting pins 160 may be provided in the pin holes 151, respectively. In certain embodiments, the pin holes 151 may be configured to hold the supporting pins 160. The pin holes 151 may be formed in the flat region 154a of the edge region 154. Alternatively, the pin holes 151 may be formed in the center region 152.

Figure 7:
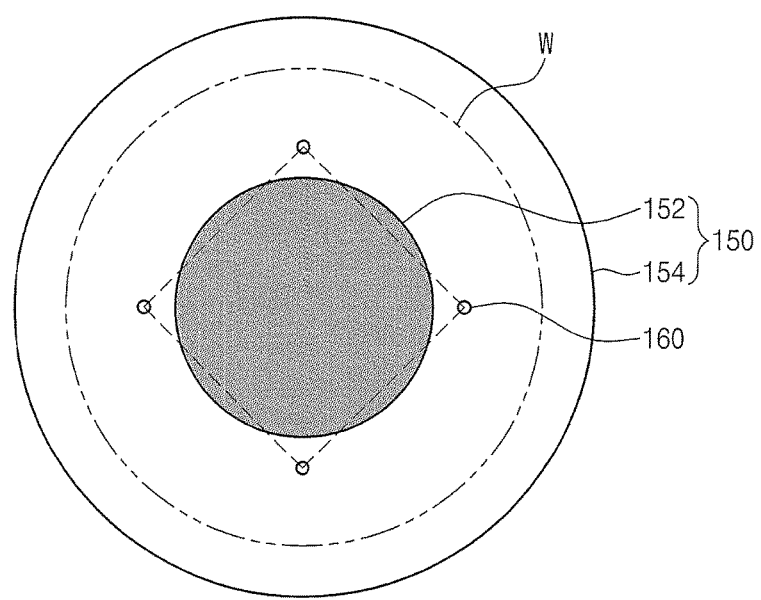
FIG. 7 is a plan view illustrating a plate of FIG. 3.

FIG. 7 is a plan view illustrating the plate 150 of FIG. 3.

Referring to FIG. 7, the number of the supporting pins 160 may be four. The four supporting pins 160 may be disposed at four vertexes defining a square. Alternatively, the number of the supporting pins 160 may be three, five, or six. Each of the supporting pins 160 may be provided at a position spaced apart from a center of the substrate W by a distance of about 70 mm-130 mm. The substrate W may have a radius of about 150 mm. Accordingly, the substrate W may vertically fluctuate during the thermal treatment process.

Figure 8:
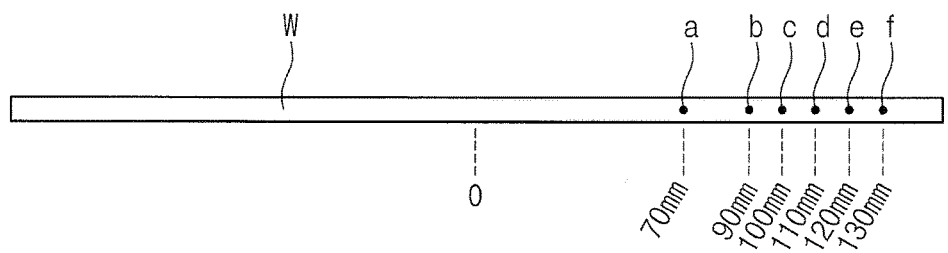
FIG. 8 is a sectional view illustrating some measurement points that are spaced apart from a center of a substrate of FIG. 7 by distances of 70 mm to 130 mm.
Figure 9:
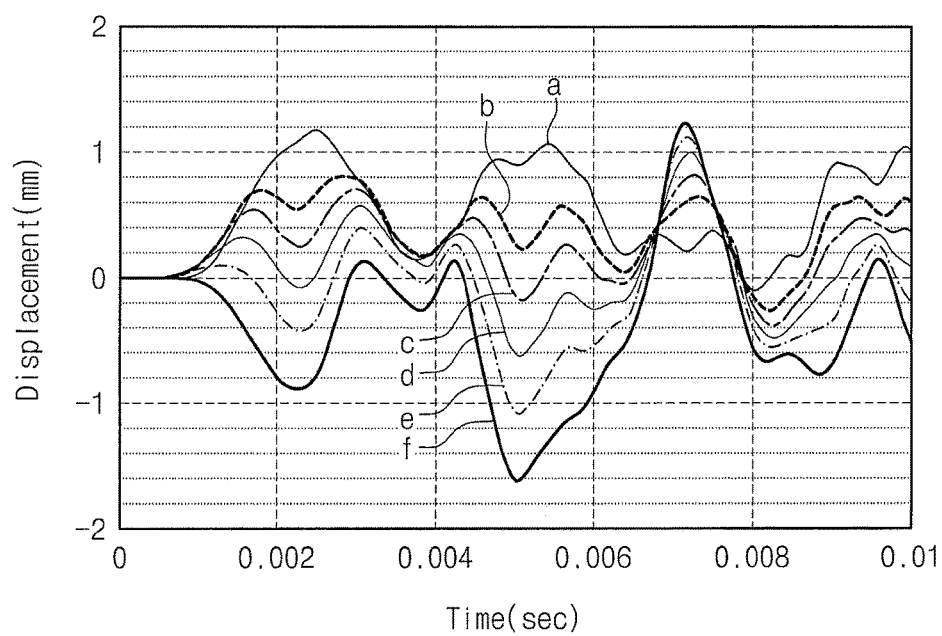
FIG. 9 is a graph showing vertical displacements of the substrate of FIG. 8 at the measurement points over the time period of 0.01 sec.

FIG. 8 illustrates some measurement points a-f that are spaced apart from a center O of the substrate W of FIG. 7 by distances of 70 mm to 130 mm. FIG. 9 shows vertical displacements of the substrate W of FIG. 8 at the measurement points a-f over the time period of 0.01 sec.

Referring to FIG. 8, points that are spaced apart by 70 mm, 90 mm, 100 mm, 110 mm, 120 mm, and 130 mm from the center O of the substrate W, were selected as the measurement points a-f. The substrate W may fluctuate in a vertical direction. For example, displacements of the substrate W at the measurement points a-f varied over time, as shown in FIG. 9. In detail, for the time period of 0.01 sec, the displacement at the measurement point a (at 70 mm distance) was about 1.2 mm in an upward direction, about −0.6 mm in a downward direction, and totally about 1.8 mm. The displacement at the measurement point b (at 90 mm distance) was about 0.8 mm in the upward direction, about −0.3 mm in the downward direction, and totally about 1.1 mm. For the substrate W of 150 mm radius, the distance (i.e., 90 mm) between the center O and the measurement point b is equal to $3/5$ the radius of the substrate W. The displacement at the measurement point c (at 100 mm distance) was 0.8 mm in the upward direction, about −0.35 mm in the downward direction, and totally about 1.15 mm. For the substrate W of 150 mm radius, the distance (i.e., 100 mm) between the center O and the measurement point c is equal to $2/3$ the radius of the substrate W. The displacement at the measurement point d (at 110 mm distance) was about 1 mm in the upward direction, about −0.6 mm in the downward direction, and totally about 1.6 mm. The displacement at the measurement point e (at 120 mm distance) was about 1.1 mm in the upward direction, about −1 mm in the downward direction, and totally about 2.1 mm. The displacement at the measurement point f (at 130 mm distance) was about 1.2 mm in the upward direction, about −1.6 mm in the downward direction, and totally about 2.8 mm.

That is, the displacement of the substrate W was smaller at the measurement points b and c (at 90 mm and 100 mm distance) than at the measurement points a, d, e, and f (at 70 mm, 110 mm, 120 mm, and 130 mm distance).

Referring back to FIGS. 7 through 9, if the supporting pins 160 are positioned between the measurement points b and c (at 90 mm and 100 mm distance), it is possible to realize the highest stability of the substrate W during the thermal treatment process. In other words, in the case where the supporting pins 160 are disposed at a distance of $3/5 *R - 2/3 *R$ (where R is the radius of the substrate W) from the center O of the substrate W on the plate 150.

It is possible to minimize a horizontal variation in vertical displacement of the substrate W. In addition, the pin holes 151 are formed on the plate 150 to be spaced apart from the center O of the substrate W by a distance of $3/5 *R - 2/3 *R$, where R is the radius of the substrate W.

Figures 10, 11:
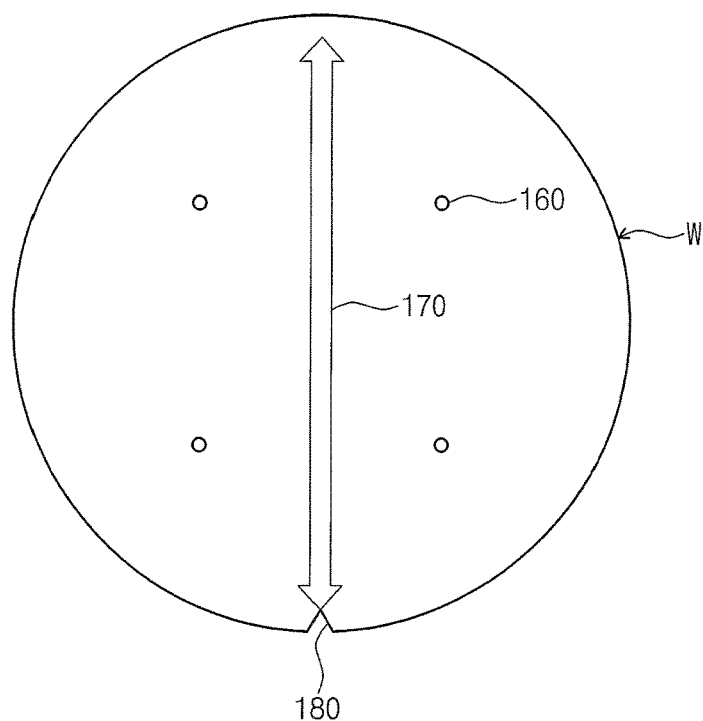
FIG. 10 is a table showing standard deviation of the vertical displacements of the substrate of FIG. 8 at the measurement points.
FIG. 11 is a plan view exemplarily illustrating orientation of a substrate relative to the supporting pins of FIG. 7.

FIG. 10 is a table showing standard deviation of the vertical displacements of the substrate W of FIG. 8 at the measurement points a-f.

Referring to FIG. 10, standard deviation of the displacement of the substrate W was smaller at the measurement points b and c (at 90 mm and 100 mm distance) than at the measurement points a, d, e, and f (at 70 mm, 110 mm, 120 mm, and 130 mm distance). For example, the standard deviation was 0.38 at the measurement point a (at 70 mm distance). The standard deviation was 0.27 at the measurement point b (at 90 mm distance). The standard deviation was 0.27 at the measurement point c (at 100 mm distance). The standard deviation was 0.34 at the measurement point d (at 110 mm distance). The standard deviation was 0.44 at the measurement point e (at 120 mm distance). The standard deviation was 0.58 at the measurement point f (at 130 mm distance). As the standard deviation decreases, the substrate W may be more stably supported by the supporting pins 160. This means that when the supporting pins 160 are spaced apart from the center O by a distance of $3/5 *r - 2/3 *r$ (where r is the radius of the substrate W), the substrate W can be most stably supported by the supporting pins 160.

FIG. 11 is a plan view exemplarily illustrating orientation of the substrate W relative to the supporting pins 160 of FIG. 7.

Referring to FIG. 11, the substrate W may be provided in such a way that an extension direction 170 of a notch 180 thereof is positioned between the supporting pins 160. The notch 180 may be formed at an edge of the substrate W to indicate the crystalline orientation (e.g., <110>) of a wafer. In the case where at least one of the supporting pins 160 is positioned on the extension direction 170 of the notch 180 of the substrate W, the supporting pins 160 may lead to crack or breakage of the substrate W. Accordingly, the substrate W may be disposed in such a way that the extension direction 170 of the notch 180 thereof is not overlapped with any of the supporting pins 160.

Figure 12:
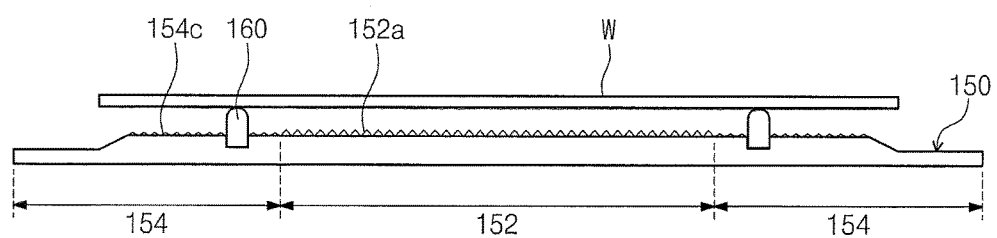
FIG. 12 is a sectional view illustrating an example of a plate of FIG. 2.

FIG. 12 is a sectional view illustrating an example of the plate 150 of FIG. 2.

Referring to FIG. 12, the plate 150 may be formed of a single transparent material, but in this case, the plate 150 may be configured in such a way that surface roughness of the center region 152 is greater than that of the edge region 154. For example, first protrusions 152a and second protrusions 154c may be provided on the center region 152 and the edge region 154, respectively. At least one of the first protrusions 152a and the second protrusions 154c may be formed by a sand etching process. In exemplary embodiments, the first protrusions 152a may be formed to have a size larger than that of the second protrusions 154c. Alternatively, the first protrusions 152a may be provided to have a density higher than that of the second protrusions 154c. The first protrusions 152a and the second protrusions 154c may be configured to cause optical scattering of the bottom light 112 incident thereto. The plate 150 may be configured to allow the bottom light 112 to be more intensively scattered by the first protrusions 152a than by the second protrusions 154c. The first protrusions 152a may be configured to scatter a fraction of the bottom light 112 concentrated on the center region 152. This may make it possible to reduce a difference in intensity between two fractions of the bottom light 112 passing through the center region 152 and the edge region 154. Alternatively, the first protrusions 152a and the second protrusions 154c may be configured to reflect the bottom light 112. The plate 150 may be configured to allow the bottom light 112 to be more intensively reflected by the first protrusions 152a than by the second protrusions 154c. The first protrusions 152a may be configured to reflect a fraction of the bottom light 112 concentrated on the center region 152. This may make it possible to allow the bottom light 112 to pass through the center region 152 and the edge region 154 of the plate 150 with a uniform intensity. Accordingly, by using the plate 150 according to exemplary embodiments of the inventive concept, it is possible to reduce a spatial variation in temperature of the substrate W, without the failure at the edge region of the substrate W.

Figure 13:
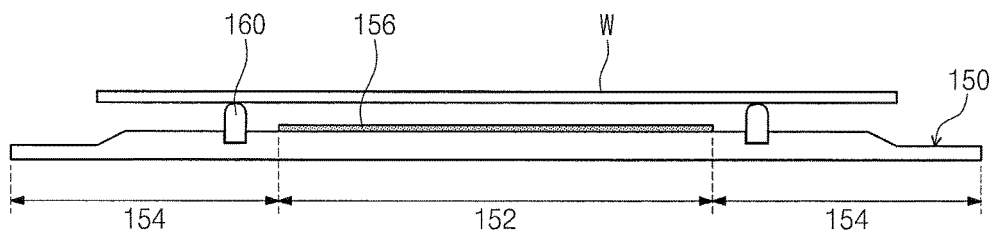
FIG. 13 is a sectional view illustrating an example of a plate of FIG. 2.

FIG. 13 is a sectional view illustrating an example of the plate 150 of FIG. 2.

Referring to FIG. 13, the plate 150 may include a light absorbing pattern 156 provided on the center region 152. In exemplary embodiments, the light absorbing pattern 156 may be formed of or include a transflective film or nano patterns. For example, the light absorbing pattern 156 may be formed of or include silicon oxide (SiO2), silicon nitride (SiN), carbon nanotube, graphene, or graphite. Alternatively, the light absorbing pattern 156 may include nano particles containing at least one of metallic, dielectric, or polymeric materials. The light absorbing pattern 156 may be provided on the top surface of the plate 150. Alternatively, the light absorbing pattern 156 may be provided on the bottom surface of the plate 150. The light absorbing pattern 156 may be configured to absorb a fraction of the bottom light 112 incident onto the center region 152.

Figure 14:
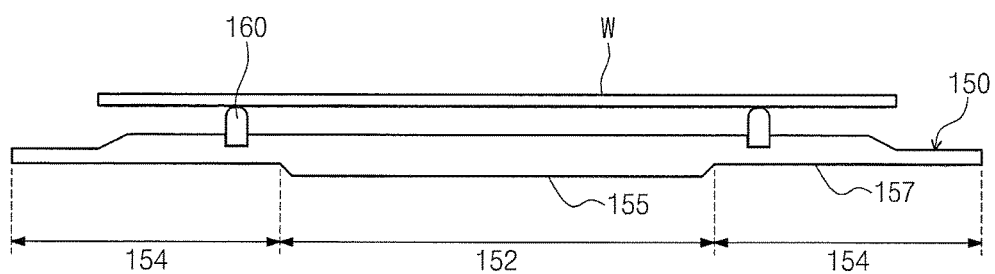
FIG. 14 is a sectional view illustrating an example of a plate of FIG. 2.

FIG. 14 is a sectional view illustrating an example of the plate 150 of FIG. 2.

Referring to FIG. 14, the plate 150 may be formed of a single transparent material, but in this case, the center region 152 of the plate 150 may be thicker than the edge region 154. For example, a bottom surface 155 of the center region 152 may be lower than a bottom surface 157 of the edge region 154. The transmittance of the plate 150 may be inversely proportional to a thickness of the plate 150. Accordingly, the transmittance of the center region 152 may be lower than that of the edge region 154. The center region 152 may absorb a fraction of the bottom light 112 propagating toward the center region of the substrate W. This may make it possible to reduce a difference in intensity between two fractions of the bottom light 112 passing through the center region 152 and the edge region 154.

Figure 15:
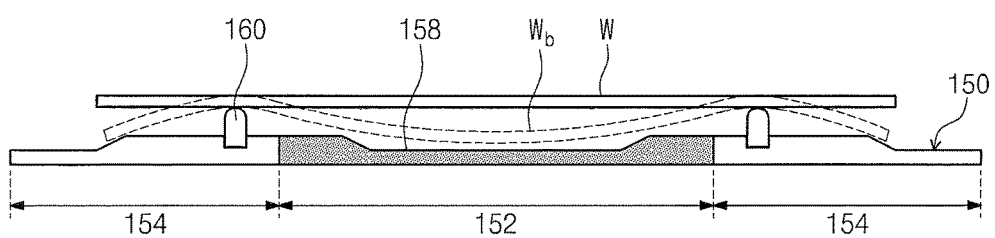
FIGS. 15 and 16 are sectional views illustrating examples of a plate of FIG. 2.
Figure 16:
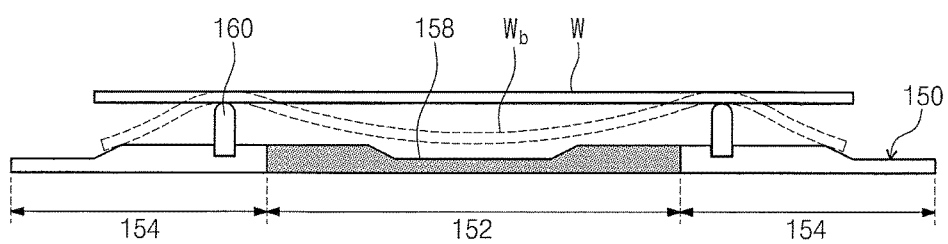

FIGS. 15 and 16 are sectional views illustrating examples of the plate 150 of FIG. 2.

Referring to FIGS. 15 and 16, the center region 152 of the plate 150 may be provided to have a trench 158. The trench 158 may be formed between the supporting pins 160. The trench 158 may prevent or suppress the bent substrate Wb from being in direct contact with the plate 150, between the supporting pins 160. In other words, the trench 158 may prevent the substrate W from being damaged by the plate 150 in the thermal treatment process. A width of the trench 158 may be changed in consideration of a height of or a distance between the supporting pins 160. For example, in the case where a height of the supporting pins 160 is increased, the trench 158 may be formed to have a reduced width. As an example, if the supporting pins 160 have a height of about 1.2 mm, the trench 158 may be formed to have a width of about 80 mm. If the supporting pins 160 have a height of about 1.4 mm, the trench 158 may be formed to have a width of about 40 mm. Also, in the case where a distance between the supporting pins 160 decreases, the trench 158 may be formed to have a reduced width.

In exemplary embodiments, the center region 152 may be configured to allow the bottom light 112 to pass therethrough with substantially the same transmittance value, without depending on the presence of the trench 158. For example, the plate 150 may be configured to have a difference in opaque impurity concentration between the trench 158 and a neighboring region outside the trench 158. Alternatively, the plate 150 may be configured to have a difference in surface roughness between the trench 158 and the neighboring region.

According to exemplary embodiments of the inventive concept, a substrate processing system may include a plate with an edge region and a center region, and the center region of the plate may have a lower transmittance value than that of the edge region. The use of the plate may make it possible to scatter a fraction of light propagating toward the center region and thereby to reduce a spatial variation in temperature of the substrate. Accordingly, it is possible to prevent a thermal treatment failure from occurring at an edge region of the substrate.

While example embodiments of the inventive concepts have been particularly shown and described, it will be understood by one of ordinary skill in the art that variations in form and detail may be made therein without departing from the spirit and scope of the attached claims.

What is claimed is:

1. A substrate processing system, comprising:
 a chamber;
 a lamp provided below the chamber; and
 a plate provided in the chamber to support a substrate,
 wherein the plate comprises:
  a center region having a first light transmittance value; and
  an edge region enclosing the center region and having a second light transmittance value higher than the first light transmittance value,
  wherein the center region and the edge region contain impurities configured to reduce light transmittance, and wherein a concentration of the impurities is higher in the center region than the edge region.

2. The substrate processing system of claim 1, further comprising a plurality of pins provided on the plate to support the substrate,
 wherein the plate comprises a plurality of pin holes formed in the edge region that are configured to hold the pins.

3. The substrate processing system of claim 2, wherein the pins are provided at a distance of ⅗ *R to ⅔ *R from a center of the substrate on the plate, wherein R is a radius of the substrate.

4. The substrate processing system of claim 2, wherein the edge region comprises:
 a flat region adjacent to the center region, the flat region having a top surface that is substantially coplanar with a top surface of the center region;
 a recess region spaced apart from the center region, the recess region having a top surface lower than the top surface of the center region; and an inclined region interposed between the recess region and the flat region, wherein the inclined region is configured such that an edge of the substrate overlies the inclined region.

5. The substrate processing system of claim 4, wherein the pin holes are provided in the flat region.

6. The substrate processing system of claim 1, wherein the center region has a surface roughness greater than a surface roughness of the edge region.

7. The substrate processing system of claim 1, wherein the center region comprises at least one light absorbing pattern.

8. The substrate processing system of claim 1, wherein the center region is thicker than the edge region, and wherein a bottom surface of the center region is lower than a bottom surface of the edge region.

9. The substrate processing system of claim 1, wherein the center region comprises a trench configured to prevent the substrate from being in direct contact with the plate center region.

10. A plate, comprising:
a center region having a first light transmittance value and including sapphire; and
an edge region enclosing the center region and having a second light transmittance value higher than the first light transmittance value, the edge region including quartz.

11. The plate of claim 10, wherein the edge region comprises a plurality of pin holes.

12. The plate of claim 11, wherein the pin holes are formed at a distance of $3/5 *R$ to $2/3 *R$ from a center of a substrate on the plate, wherein R is a radius of the substrate.

13. The plate of claim 11, wherein the edge region comprises:
a flat region adjacent to the center region, the flat region comprising the pin holes and having a top surface substantially coplanar with a top surface of the center region;
a recess region spaced apart from the center region, the recess region having a top surface lower than the top surface of the center region; and
an inclined region interposed between the recess region and the flat region.

14. The plate of claim 10, wherein the center region comprises a trench.

15. A substrate processing system, comprising:
a chamber;
a plate provided in the chamber and configured to support a substrate, wherein the plate comprises a center region having a first light transmittance value, and an edge region having a second light transmittance value different from the first light transmittance value, wherein the edge region comprises:
a flat region having a top surface that is substantially coplanar with a top surface of the center region;
a recess region having a top surface lower than the top surface of the center region; and
an inclined region interposed between the recess region and the flat region, wherein the inclined region is configured such that an edge of the substrate supported by the plate overlies the inclined region; and
at least one lamp positioned below the chamber and configured to emit light toward the plate.

16. The substrate processing system of claim 15, wherein the center region contains impurities configured to reduce light transmittance of the center region.

17. The substrate processing system of claim 15, wherein the center region has a surface roughness greater than a surface roughness of the edge region or wherein the center region comprises at least one light absorbing pattern.

18. The substrate processing system of claim 15, wherein the center region is thicker than the edge region, wherein a bottom surface of the center region is lower than a bottom surface of the edge region, and wherein the center region comprises a trench.

* * * * *